United States Patent
A et al.

(10) Patent No.: US 8,847,656 B1
(45) Date of Patent: Sep. 30, 2014

(54) APPROACH FOR DRIVING MULTIPLE MOSFETS IN PARALLEL FOR HIGH POWER SOLID STATE POWER CONTROLLER APPLICATIONS

(71) Applicant: Honeywell International, Inc., Morristown, NJ (US)

(72) Inventors: Ezekiel A, Chotanikara (IN); Zhenning Liu, Mississauga (CA); Vinod Kunnambath, Thrissur (IN); Prashant Purushotham Prabhu K, Bangalore (IN); Randy Fuller, Hillsburgh (CA); Narendra Rao, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/934,466

(22) Filed: Jul. 3, 2013

(51) Int. Cl.
*H03K 5/08* (2006.01)

(52) U.S. Cl.
USPC ............................ 327/310; 327/311; 327/318

(58) Field of Classification Search
USPC ........................................ 327/310, 311, 318
See application file for complete search history.

(56) References Cited

U.S. PATENT DOCUMENTS

| | | | |
|---|---|---|---|
| 6,373,731 B1 * | 4/2002 | Iwamura et al. | 363/56.05 |
| 6,531,908 B1 * | 3/2003 | Goeser et al. | 327/309 |
| 7,053,678 B2 * | 5/2006 | Scollo et al. | 327/108 |
| 7,982,490 B2 * | 7/2011 | Kurokawa et al. | 326/27 |
| 7,982,508 B2 * | 7/2011 | Aoki et al. | 327/108 |
| 2013/0021700 A1 | 1/2013 | Greither | |

OTHER PUBLICATIONS

Dodge, Jonathan, "Eliminating Parasitic Oscillation between Parallel MOSFETS", Application Note, APT-0402 Rev A, Mar. 25, 2004, based in part on a paper presented at Power Electronics Technology 2003 conference titled "Issues with Paralleling MOSFETs and IGBTs".

Hall, B., "Paralleling Power MOSFETs Successfully", Siemens Components (English Edition), vol. 20, Issue 2, Apr. 1985, pp. 72-6ff, ISSN: 0173-1734, SICOD5, West Germany.

* cited by examiner

*Primary Examiner* — Kenneth B. Wells
(74) *Attorney, Agent, or Firm* — Shimokaji & Assoc., P.C.

(57) ABSTRACT

A system that drives multiple MOSFETs in parallel for direct current and alternating current solid state power controller applications may include networks connected to the gates of the MOSFETs to protect the MOSFETs from being damaged during high current interruption. For direct current applications, the system may include a switching protection and damping network and a gate drive balancing network. For alternating current applications, the system may include two switching protection and damping networks and a gate drive balancing network.

14 Claims, 3 Drawing Sheets

APPROACH FOR DRIVING MULTIPLE MOSFETS IN PARALLEL FOR HIGH POWER SOLID STATE POWER CONTROLLER APPLICATIONS

BACKGROUND OF THE INVENTION

Solid State Power Controller (SSPC) technology may be gaining acceptance as a modern alternative to the combination of conventional electro-mechanical relays and circuit breakers for commercial aircraft power distribution as it may have high reliability, "soft" switching characteristics, fast response time, and ability to facilitate advanced load management and other aircraft functions. While SSPCs with current rating under 20 A may have been widely utilized in aircraft secondary distribution systems, power dissipation, voltage drop, and leakage current associated with solid state power switching devices may pose challenges for using SSPCs in high voltage applications of aircraft primary distribution systems with higher current ratings.

As can be seen, there is a need for a system and method for driving multiple MOSFETs (metal oxide semiconductor field effect transistors) in parallel for high power solid state power controller applications.

SUMMARY

In one aspect of the invention, a system for driving metal oxide semiconductor field effect transistors for direct current solid state power controller applications comprises a switch protection and damping network including a transient voltage suppressor in connection with at least a first resistor-inductor circuit; a gate driver configured to drive at least one metal oxide semiconductor field effect transistor through a gate drive balancing and damping network, wherein the gate drive balancing and damping network is connected to the gate driver through a gate resistor, and is also connected to the switch protection and damping network; a first resistor-inductor-capacitor circuit in the gate drive balancing and damping network; and the at least one metal oxide semiconductor field effect transistor connected to the switch protection and damping network and connected to the gate driver balancing and damping network.

In another aspect of the invention, a system for driving metal oxide semiconductor field effect transistors for alternating current solid state power controller applications comprises a first switch protection and damping network including a first blocking diode; a first transient voltage suppressor in series with the first blocking diode; a first resistor-inductor circuit in series with the first transient voltage suppressor; and a second switch protection and damping network including: a second blocking diode; a second transient voltage suppressor in series with the second blocking diode; a second resistor-inductor circuit in series with the second transient voltage suppressor; a gate drive balancing and damping network; a gate driver configured to drive a first one of the at least one metal oxide semiconductor field effect transistor, and a second one of the at least one metal oxide semiconductor field effect transistor, through a gate resistor in series with a gate drive balancing and damping network, wherein the gate drive balancing and damping network includes a resistor-inductor-capacitor circuit; and the first one of the at least one metal oxide semiconductor field effect transistor is connected to the first switch protection and damping network, and the second one of the at least one metal oxide semiconductor field effect transistor is connected to the second switch protection and damping network.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features. However, any single inventive feature may not address any of the problems discussed above or may only address one of the problems discussed above. Further, one or more of the problems discussed above may not be fully addressed by any of the features described below.

Broadly, an embodiment of the present invention generally provides a gate drive control of parallel MOSFETs for their safe power switching operations during various fault conditions.

More specifically, the present invention may utilize networks of components in parallel with the MOSFETs in order to prevent potential MOSFET failures as a result of high level of fault current interruptions.

Figure 1:
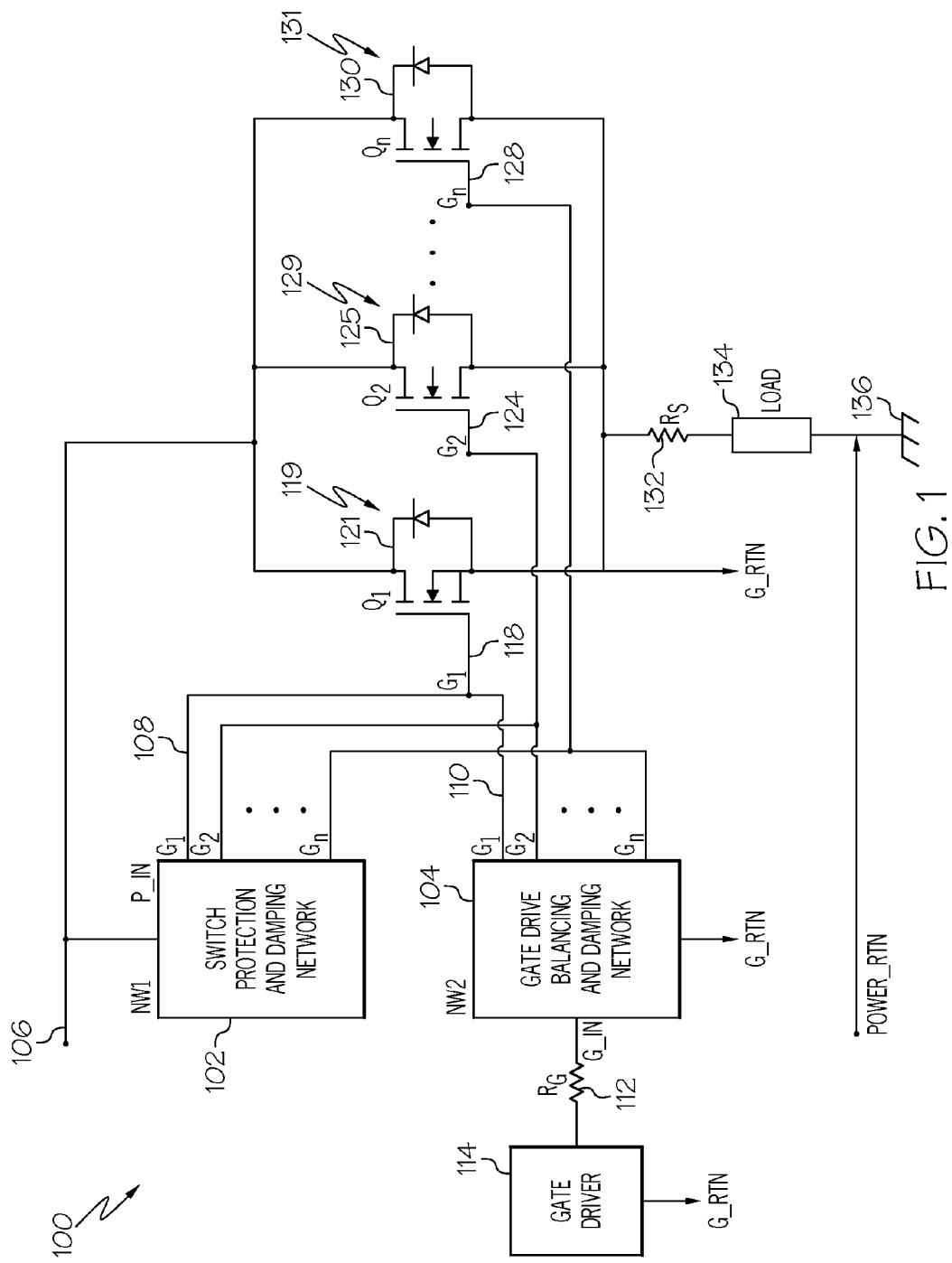
FIG. 1 illustrates a schematic circuit view of a driver that drives multiple metal oxide semiconductor field effect transistors in parallel for direct current solid state power controller applications.

FIG. 1 illustrates a driver 100 that drives multiple MOSFETs 119, 129, and 131 in parallel for direct current solid state power controller applications. The driver 100 is shown with two circuit networks, a switching protection and damping network 102, and a gate drive balancing network 104, in addition to a commercial out of shelf MOSFET gate driver integrated circuit (IC) 114 and a gate drive resistor $R_G$ 112. In an exemplary embodiment, the switching protection and damping network 102 may be connected together with the gate drive balancing network 104 at gates 108, and 110, respectively. The networks 102, 104 may connect to MOSFETs 119, 129 and 131 at gates 108, and 110, respectively. The gate driver 114 may receive a digital logic signal ("0" or "1") at its input, and translate it into, for example, either 0 or 15 volt at its output that connects to the gate resistor $R_G$ 112, and then control the MOSFETs 119, 129, and 131 by turning on/off the MOSFETs 119, 129, and 131 through the network 104.

In an exemplary embodiment, the gate driver 114 may be connected in series with the gate drive balancing and damping network 104. A resistor $R_G$ 112 may be placed in between the gate driver 114 and gate balancing and damping network 104, and may aid in controlling input voltage from the gate driver 114. A resistor $R_S$ 132 may be placed between the MOSFETs 119, 129, and 131 and a load 134 for current sensing purposes. The load 134 may be placed between the current sensing resistor $R_S$ 132 and a ground 136. The switching protection and damping network 102 may connect to the MOSFETs 119, 129, and 131 through multiple gates 108. The gate drive balancing and damping network 104 may connect to the MOSFETs 119, 129, and 131 through multiple gates 110 which are outputs of the gate drive balancing and damping network 104.

The switching protection and damping network 102 may include a transient voltage suppressor (TVS, either bi-directional, or single-directional), and a damping circuitry mainly consisting of passive electronic components. An example showing a TVS with damping circuitry is described further below in the discussion of FIG. 3. The switching protection and damping network 102 may prevent the power across the MOSFETs 119, 129, and 131 from exceeding their breakdown voltages as a result of significant voltage spikes during turning off of the MOSFETS 119, 129, and 131 with large inductive loads or large fault currents, and may eliminate any potential impacts to each gate 118, 124, 128 of the MOSFETs 119, 129, and 131 as a result of these voltage spikes. The input voltage 106 may be, for example, 270 volts. During MOSFET turn off, whenever the voltage across the MOSFETs 119, 129, and 131 rises above a predetermined threshold, the TVSs, with preselected corresponding breakdown voltages, may provide a circuit path between the drains 121, 125, and 130 and the gates 118, 124, 128 of each parallel MOSFET 119, 129, and 131 through the switching protection and damping network 102, forcing the off-turning MOSFETs 119, 129, and 131 to conduct again, thus clamping the voltage across the MOSFETs 119, 129, and 131. The switching protection and damping network 102 may suppress the potential oscillations at each gate of the MOSFET 119, 129, and 131 sourced from this new circuit path formed by TVSs in the switching protection and damping network 102. The advantage of using the TVS may lie in a fast response time (normally in nano seconds) which may be an important factor as the frequency of the voltage spikes may be expected in the range of hundreds of kilo-Hertz (kHz).

Examples of a gate drive balancing and damping network 104 are described in further detail below in the description of FIG. 3. The gate drive balancing and damping network 104 may form a normal gating path for turning on & off a MOSFET 119, 129, and 131, but may have a capability of suppressing parasitic oscillations. The gate drive balancing and damping network 104 may include passive components and may offer low impedance below a specified threshold for frequencies up to 1 MHz which may ensure conductivity for turning on & off input signals to the MOSFETs 119, 129, and 131. The gate drive balancing and damping network 104 may help to compensate potential "mismatches" in MOSFET 119, 129, and 131 gating signals among parallel MOSFETs 119, 129, 131 during power switching transients by evening up (or averaging) the dynamic gate drive voltage variations among a plurality of gates 118, 124, and 128 of all parallel MOSFETs 119, 129, 131 during power switching transients, so that all the parallel MOSFETs 119, 129, 131 may be switched on/off at the same time.

Figure 2:
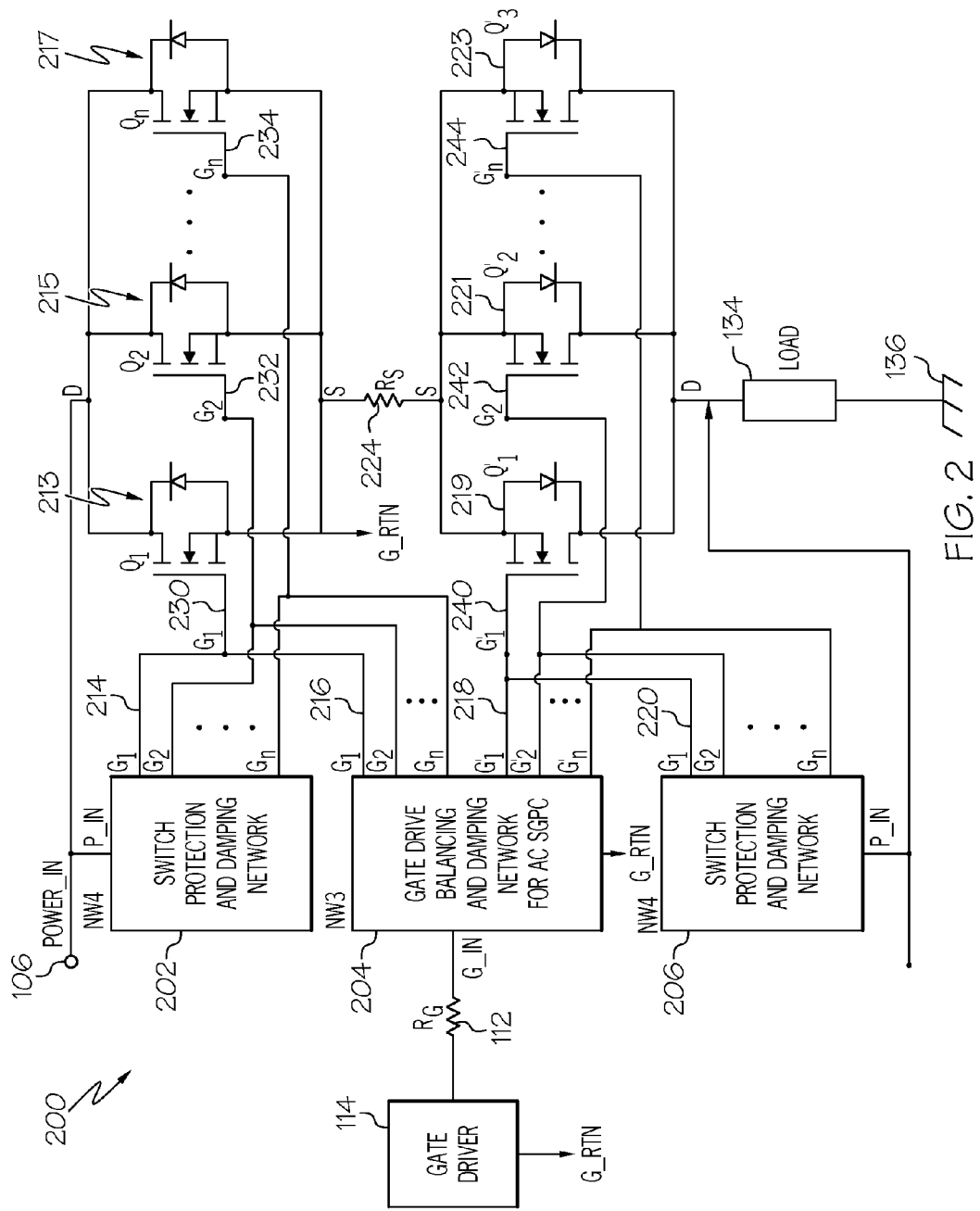
FIG. 2 illustrates a schematic circuit view of a driver that drives multiple metal oxide semiconductor field effect transistors in parallel for alternating current solid state power controller applications.

Referring to FIG. 1 and FIG. 2, FIG. 2 illustrates a driver 200 that drives multiple MOSFETs 213, 215, 217, 219, 221, and 223 in parallel for alternating current solid state power controller applications. The driver 200 may drive a first group of MOSFETS 213, 215, and 217, and a second group of MOSFETs 219, 221, and 223. FIG. 2 shows two switch protection and damping networks 202, 206. FIG. 2 also shows a gate drive balancing and damping network 204.

The switch protection and damping networks 202, and 206 may be both connected to the gate drive balancing and damping network 204. An example switch protection and damping network and example gate drive balancing and damping network is shown in FIG. 3. A first switch protection and damping network 202 may protect the first group of MOSFETs 213, 215, and 217 from over voltage due to voltage spikes during high current interruption and eliminate any potential impacts as a result of these voltage spikes to each gate 230, 232, and 234 of the MOSFETs 213, 215, and 217, while a second switch protection and damping network 206 may protect a second group of MOSFETs 219, 221, and 223 from over voltage due to voltage spikes during high current interruption and eliminate any potential impacts as a result of these voltage spikes to each gate 240, 242, and 244 of the MOSFETs 219, 221, and 223. Gates $G_1$-$G_n$ 214 of the first switch protection and damping network 202 and gates $G_1$-$G_n$ 220 of the second switch protection and damping network 206 may connect to a gate G'x (x=1 to n) 216 or 218 of the gate drive balancing and damping network 204. A resistor $R_S$ 224 may connect between the MOSFETs 213, 215, 217 and 219, 221, and 223 for current sensing purpose. There may be more than three MOSFETS connected to the first switch protection and damping network 202 and the second switch protection and damping network 206. Gates 214 of the first switch protection and damping network 202 and gates 216 of the gate drive balancing and damping network 204 may be connected to gates 230, 232, and 234 of the MOSFETs 213, 215, and 217. Gates 220 of the second switch protection and damping network 202 and gates 218 of the gate drive balancing and damping network 204 may be connected to gates 240, 242, and 244 of the MOSFETs 219, 221, and 223.

Figure 3:
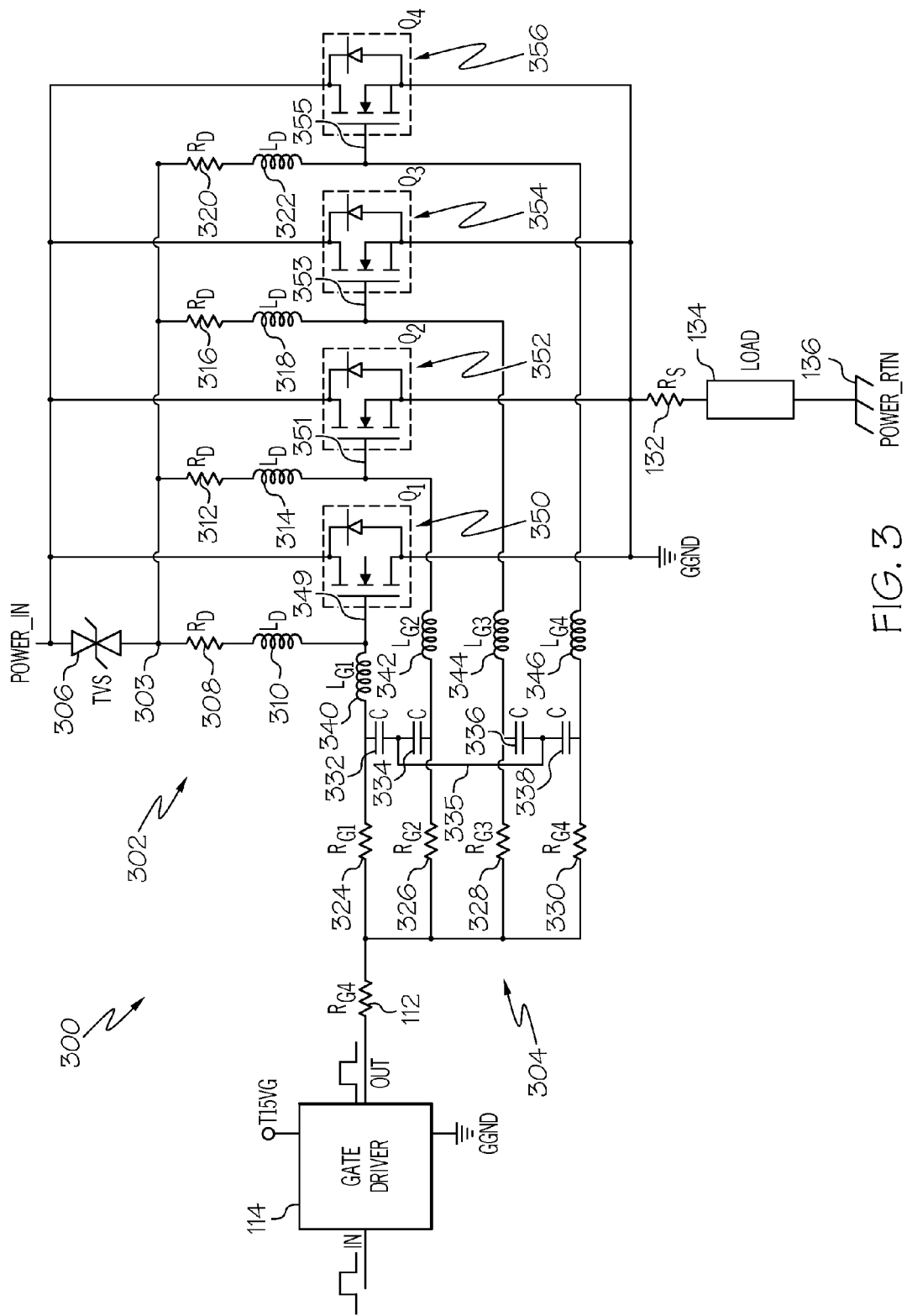
FIG. 3 illustrates a schematic circuit view of example circuits for a switch protection and damping network and a gate drive balancing and damping network.

Referring to FIG. 1-3, FIG. 3 illustrates example circuits 300 for a switch protection and damping network 302 and a gate drive balancing and damping network 304. The circuits shown in FIG. 3 are in more detail than those shown in FIGS. 1 and 2.

The switch protection and damping network 302 may include resistor-inductor (RL) circuits (308, 310), (312, 314), (316, 318), and (320, 322), and a transient voltage suppressor 306 such as a bi-directional transient voltage suppressor, which may together protect against voltage spikes in multiple parallel MOSFETs 350, 352, 354, and 356. The transient voltage suppressor 306 may suppress voltage spikes as mentioned in the discussion of FIG. 1 above. The RL circuits (308, 310), (312, 314), (316, 318), and (320, 322) may dampen high frequency perturbations sourced from these voltage spikes.

An additional diode at a location 303 may be added in series with the TVS 306, with its cathode terminal connects to resistors 308, 312, 316, and 320, when this switch protection and damping network 302 is used in the configuration shown in FIG. 2 for alternating current applications. The diode 303 may help to block an alternating current from flowing through the circuit path formed by various gate drive networks mentioned above.

The RL circuits (308, 310), (312, 314), (316, 318), and (320, 322) may be in series with the transient voltage suppressor 306. Each of the RL circuits (308, 310), (312, 314), (316, 318) and (320, 322) may be connected in series with one of the gates 349, 351, 353, and 355 of the MOSFETs 350, 352, 354, and 356.

The gate drive balancing and damping network 304 may include gate resistor-inductor-capacitor (RLC) circuits (324, 340, 332), (326, 342, 334), (328, 344, 336) and (330, 346, 338) which may prevent parasitic oscillations from the multiple parallel MOSFETs 350, 352, 354, and 356. The RL portion of the RLC circuits may dampen high frequency parasitic oscillations as mentioned above. The capacitors 332, 334, 336, and 338 in the RLC circuits (324, 340, 332), (326, 342, 334), (328, 344, 336), may help even up (or average) the dynamic gate drive voltage variations among a plurality of gates 349, 351, 353, and 355 of all parallel MOSFETs 350, 352, 354, and 356 during power switching transients, so that all these parallel MOSFETs 350, 352, 354, and 356 may be switched on/off at the same time.

The inductors 340, 342, 344 and 346 may be, for example, ferrite beads that may be selected such that they may offer zero impedance for frequencies up to 1 Mega-Hertz (MHz). The capacitors 332, 334, 336, and 338 may be attached to the resistors 324, 326, 328, and 330 and inductors 340, 342, 344, and 346 between the resistors 324, 326, 328, and 330 and inductors 340, 342, 344 and 346. In an exemplary embodiment, the capacitors 332, 334, 336, and 338 may be attached to each other by, for example, a line 335. In the example shown in FIG. 3, capacitor 332 is connected in series with capacitor 334 between gates of a first MOSFET 350 and a second MOSFET 352.

It should be understood, of course, that the foregoing relates to exemplary embodiments of the invention and that modifications may be made without departing from the spirit and scope of the invention as set forth in the following claims.

We claim:

1. A system for driving metal oxide semiconductor field effect transistors for direct current solid state power controller applications comprising:
    a switch protection and damping network including a transient voltage suppressor in connection with at least a first resistor-inductor circuit;
    a gate driver configured to drive at least one metal oxide semiconductor field effect transistor through a gate drive balancing and damping network, wherein the gate drive balancing and damping network is connected to the gate driver through a gate resistor, and is also connected to the switch protection and damping network;
    a first resistor-inductor-capacitor circuit in the gate drive balancing and damping network; and
    the at least one metal oxide semiconductor field effect transistor connected to the switch protection and damping network and connected to the gate drive balancing and damping network.

2. The system of claim 1, wherein the switch protection and damping network includes the first resistor-inductor circuit in connection with a second resistor-inductor circuit at one end of each resistor-inductor circuit.

3. The system of claim 2, wherein the first resistor-inductor circuit is connected in series to a gate of a first one of the at least one metal oxide semiconductor field effect transistors, and the second resistor-inductor circuit is connected in series with a gate of a second one of the at least one metal oxide semiconductor field effect transistors.

4. The system of claim 1, wherein the gate drive balancing and damping network has impedance below a specified threshold for frequencies of the gate drive signal up to 1 Mega Hertz.

5. The system of claim 1, wherein the gate drive balancing and damping network includes the first resistor-inductor-capacitor circuit in connection with a second resistor-inductor-capacitor circuit.

6. A system for driving metal oxide semiconductor field effect transistors for alternating current solid state power controller applications comprising:
    a first switch protection and damping network including:
        a first blocking diode;
        a first transient voltage suppressor in series with the first blocking diode;
        a first resistor-inductor circuit in series with the first transient voltage suppressor; and
    a second switch protection and damping network including:
        a second blocking diode;
        a second transient voltage suppressor in series with the second blocking diode;
        a second resistor-inductor circuit in series with the second transient voltage suppressor;
    a gate drive balancing and damping network;
    a gate driver configured to drive a first one of the at least one metal oxide semiconductor field effect transistor, and a second one of the at least one metal oxide semiconductor field effect transistor, through a gate resistor in series with a gate drive balancing and damping network, wherein the gate drive balancing and damping network includes a resistor-inductor-capacitor circuit; and
    the first one of the at least one metal oxide semiconductor field effect transistor is connected to the first switch protection and damping network, and the second one of the at least one metal oxide semiconductor field effect transistor is connected to the second switch protection and damping network.

7. The system of claim 6, wherein the first switch protection and damping network includes the first resistor-inductor circuit in connection with a third resistor-inductor circuit.

8. The system of claim 6, wherein the second switch protection and damping network includes the second resistor-inductor circuit in connection with a fourth resistor-inductor circuit.

9. The system of claim 7, wherein the first resistor-inductor circuit is connected in series to a gate of the first one of the at least one metal oxide semiconductor field effect transistor, and the third resistor-inductor circuit is connected in series with a gate of the second one of the at least one metal oxide semiconductor field effect transistor.

10. The system of claim 8, wherein the second resistor-inductor circuit is connected in series to a gate of a third one of the at least one metal oxide semiconductor field effect transistor, and the fourth inductor-series circuit is connected in series with a gate of a fourth one of the at least one metal oxide semiconductor field effect transistor.

11. The system of claim 6, wherein a connecting resistor is placed between a source of the first one of the at least one metal oxide semiconductor field effect transistor and a source of the second one of the at least one metal oxide field effect transistor.

12. The system of claim 6, wherein the first switch protection and damping network and the second switch protection and damping network are connected to the gate drive balancing and damping network.

13. The system of claim 6, wherein the gate balancing and damping network includes a first capacitor of the resistor-inductor-capacitor circuit in connection with a second capacitor of a second resistor-inductor-capacitor circuit of the gate drive balancing and damping network.

14. The system of claim 6, wherein the first one of the at least one metal oxide semiconductor field effect transistor is in a first group that includes more than one metal oxide semiconductor field effect transistor that are parallel with each other, and the second one of the at least one metal oxide semiconductor field effect transistor is in a second group that includes more than one metal oxide semiconductor field effect transistor that are parallel with each other.

* * * * *